(12) United States Patent
Xiang et al.

(10) Patent No.: US 7,071,065 B1
(45) Date of Patent: Jul. 4, 2006

(54) STRAINED SILICON PMOS HAVING SILICON GERMANIUM SOURCE/DRAIN EXTENSIONS AND METHOD FOR ITS FABRICATION

(75) Inventors: Qi Xiang, San Jose, CA (US); Eric N. Paton, Morgan Hill, CA (US); Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 161 days.

(21) Appl. No.: 10/738,716

(22) Filed: Dec. 17, 2003

Related U.S. Application Data

(62) Division of application No. 10/282,559, filed on Oct. 29, 2002, now Pat. No. 6,703,648.

(51) Int. Cl.
*H01L 21/336* (2006.01)

(52) U.S. Cl. .................. 438/285; 438/301; 438/933

(58) Field of Classification Search ............ 438/167, 438/151, 285, 287, 933, 938, 123, 301
See application file for complete search history.

(56) References Cited

U.S. PATENT DOCUMENTS

| | | | |
|---|---|---|---|
| 5,891,769 A * | 4/1999 | Liaw et al. ............... | 438/167 |
| 6,225,176 B1 | 5/2001 | Yu | |
| 6,274,894 B1 * | 8/2001 | Wieczorek et al. ......... | 438/285 |
| 6,303,451 B1 | 10/2001 | Zhang et al. | |
| 6,326,664 B1 | 12/2001 | Chau et al. | |
| 6,361,874 B1 | 3/2002 | Yu | |
| 6,506,653 B1 | 1/2003 | Furukawa et al. | |
| 6,518,155 B1 | 2/2003 | Chau et al. | |
| 6,524,920 B1 | 2/2003 | Yu | |
| 6,852,600 B1 * | 2/2005 | Wang et al. ............... | 438/301 |
| 6,878,592 B1 * | 4/2005 | Besser et al. .............. | 438/285 |
| 6,921,913 B1 * | 7/2005 | Yeo et al. ................. | 438/285 |
| 2001/0028067 A1 * | 10/2001 | Awano ..................... | 438/285 |

\* cited by examiner

*Primary Examiner*—Walter L Lindsay, Jr.
(74) *Attorney, Agent, or Firm*—Foley & Lardner LLP

(57) ABSTRACT

A strained silicon p-type MOSFET utilizes a strained silicon channel region formed on a silicon germanium substrate. Silicon germanium regions are formed on the silicon germanium layer adjacent to ends of the strained silicon channel region, and shallow source and drain extensions are implanted in the silicon germanium material. The shallow source and drain extensions do not extend into the strained silicon channel region. By forming the source and drain extensions in silicon germanium material rather than in silicon, source and drain extension distortions caused by the enhanced diffusion rate of boron in silicon are avoided.

19 Claims, 5 Drawing Sheets

STRAINED SILICON PMOS HAVING SILICON GERMANIUM SOURCE/DRAIN EXTENSIONS AND METHOD FOR ITS FABRICATION

RELATED APPLICATIONS

This application is a divisional of application Ser. No. 10/282,559, filed Oct. 29, 2002 now U.S. Pat. No. 6,703,648, the entirety of which is incorporated herein by reference.

BACKGROUND OF THE INVENTION

1. Field of the Invention

The present invention relates generally to fabrication of metal oxide semiconductor field effect transistors (MOSFETs), and, more particularly, to MOSFETs that achieve improved carrier mobility through the incorporation of strained silicon.

2. Related Technology

MOSFETs are a common component of integrated circuits (ICs). FIG. 1 shows a conventional MOSFET device. The MOSFET is fabricated on a semiconductor substrate 10 within an active area bounded by shallow trench isolations 12 that electrically isolate the active area of the MOSFET from other IC components fabricated on the substrate 10.

The MOSFET is comprised of a gate electrode 14 that is separated from a channel region 16 in the substrate 10 by a thin first gate insulator 18 such as silicon oxide or oxide-nitride-oxide (ONO). To minimize the resistance of the gate 14, the gate 14 is typically formed of a doped semiconductor material such as polysilicon.

The source and drain of the MOSFET are provided as deep source and drain regions 20 formed on opposing sides of the gate 14 and channel region 16. Source and drain silicides 22 are formed on the source and drain regions 20 and are comprised of a compound comprising the substrate semiconductor material and a metal such as cobalt (Co) or nickel (Ni) to reduce contact resistance to the source and drain regions 20. The source and drain regions 20 are formed deeply enough to extend beyond the depth to which the source and drain silicides 22 are formed. The source and drain regions 20 are implanted subsequent to the formation of a spacer 24 around the gate 14 and gate insulator 18 which serves as an implantation mask to define the lateral position of the source and drain regions 20 relative to the channel region 16 beneath the gate.

The gate 14 likewise has a silicide 26 formed on its upper surface. The gate structure comprising a polysilicon material and an overlying silicide is sometimes referred to as a polycide gate.

The source and drain of the MOSFET further comprise shallow source and drain extensions 28. As dimensions of the MOSFET are reduced, short channel effects resulting from the small distance between the source and drain cause degradation of MOSFET performance. The use of shallow source and drain extensions 28 rather than deep source and drain regions near the ends of the channel 16 helps to reduce short channel effects. The shallow source and drain extensions are implanted prior to the formation of the spacer 24 and after formation of a thin spacer 30, and the gate 14 and thin spacer 30 act as an implantation mask to define the lateral position of the shallow source and drain extensions 28 relative to the channel region 16. Diffusion during subsequent annealing causes the source and drain extensions 28 to extend slightly beneath the gate 14.

One option for increasing the performance of MOSFETs is to enhance the carrier mobility of silicon so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is generally more widely spaced than a pure silicon lattice as a result of the presence of the larger germanium atoms in the lattice. Because the atoms of the silicon lattice align with the more widely spread silicon germanium lattice, a tensile strain is created in the silicon layer. The silicon atoms are essentially pulled apart from one another. The amount of tensile strain applied to the silicon lattice increases with the proportion of germanium in the silicon germanium lattice.

Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET using a strained silicon layer is shown in FIG. 2. The MOSFET is fabricated on a substrate comprising a silicon germanium layer 32 on which is formed an epitaxial layer of strained silicon 34. The MOSFET uses conventional MOSFET structures including deep source and drain regions 20, shallow source and drain extensions 28, a gate oxide layer 18, a gate 14 surrounded by a gate spacers 30, 24, silicide source and drain contacts 22, a silicide gate contact 26, and shallow trench isolations 12. The channel region of the MOSFET includes the strained silicon material, which provides enhanced carrier mobility between the source and drain.

One detrimental effect observed in MOSFETs having small critical dimensions is a short channel effect known as punchthrough. Punchthrough occurs when the channel length of the device is sufficiently short to allow the depletion regions at the ends of the source and drain extensions to overlap, thus effectively merging the two depletion regions. Any increase in reverse-bias drain voltage beyond that required to establish punchthrough lowers the potential energy barrier for majority carriers in the source, resulting in a punchthrough current between the source and drain that must be suppressed for proper device operation.

The punchthrough problem is exacerbated in PMOS devices because the typical p-type dopant boron (B) has a high rate of diffusion in silicon. As a result, shallow source and drain extensions tend to diffuse during activation, causing the ends of the source and drain extensions to become nearer to each other and to therefore create a greater risk of punchthrough. This problem occurs in both regular PMOS devices and PMOS devices employing a strained silicon layer as shown in FIG. 2.

SUMMARY OF THE INVENTION

It is an object of the present invention to provide a strained silicon PMOS device that is resistant to degradation by short channel effects such as punchthrough.

In accordance with embodiments of the invention, a strained silicon PMOS utilizes a strained silicon channel region and silicon germanium in the source and drain regions. The rate of diffusion of boron is lower in silicon germanium than in silicon. As a result, shallow p-type source and drain extensions formed in silicon germanium exhibit a lower rate of diffusion than if formed in silicon. By forming the p-type source and drain extensions in silicon germanium regions rather than in silicon, source and drain extension distortions caused by the enhanced diffusion rate of boron in silicon are avoided.

In accordance with one embodiment of the invention, a p-type MOSFET is formed by a method that includes providing a substrate comprising a layer of silicon germanium having a layer of strained silicon formed thereon, and having a gate insulator formed on the strained silicon layer and a gate formed on the gate insulator. A first spacer is formed around the gate and gate insulator, and then the strained silicon layer is etched to form a strained silicon channel region beneath the gate insulator. Silicon germanium regions are then implanted adjacent to ends of the strained silicon channel region, and shallow source and drain extensions are formed adjacent to ends of the channel region. The boron shallow source and drain extensions do not extend into to the strained silicon channel region, and therefore the boron dopant diffuses at a relatively low rate during activation.

In accordance with another embodiment of the invention, a p-type MOSFET comprises a substrate comprising a layer of silicon germanium, a strained silicon channel region formed on the layer of silicon germanium, a gate insulator formed on the strained silicon channel region, and silicon germanium regions formed on the layer of silicon germanium on opposing sides of the channel region. A gate is formed on the gate insulator, deep source and drain regions are formed in the silicon germanium regions on opposing sides of the channel region, and shallow source and drain extensions are formed in the silicon germanium regions and extend from the source and drain regions toward the channel region. The boron shallow source and drain extensions do not extend into to the strained silicon channel region, and therefore the boron dopant diffuses at a relatively low rate during activation.

DESCRIPTION OF THE DRAWINGS

Embodiments of the invention are described in conjunction with the following drawings, in which.

DETAILED DESCRIPTION OF PREFERRED EMBODIMENTS

Figure 1:
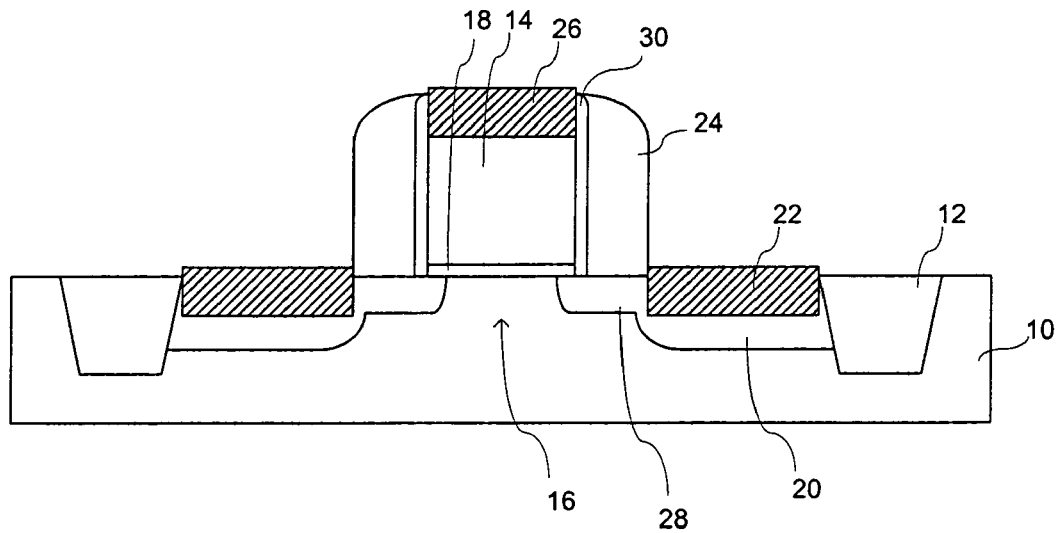
FIG. 1 shows a conventional MOSFET formed in accordance with conventional processing.
Figure 2:
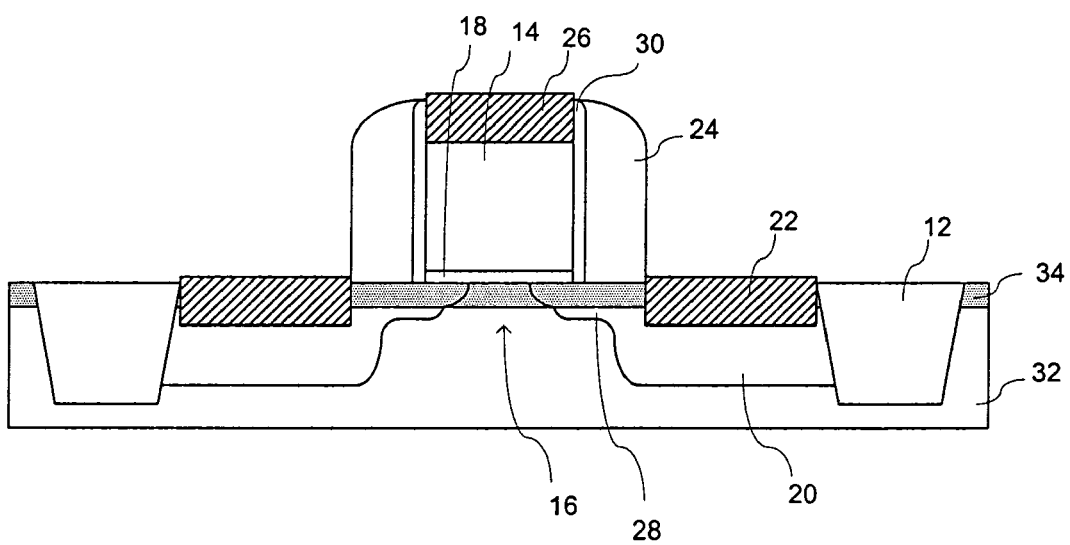
FIG. 2 shows a strained silicon PMOS device formed in accordance with the conventional processing used to form the MOSFET of FIG. 1.
Figure 3A:
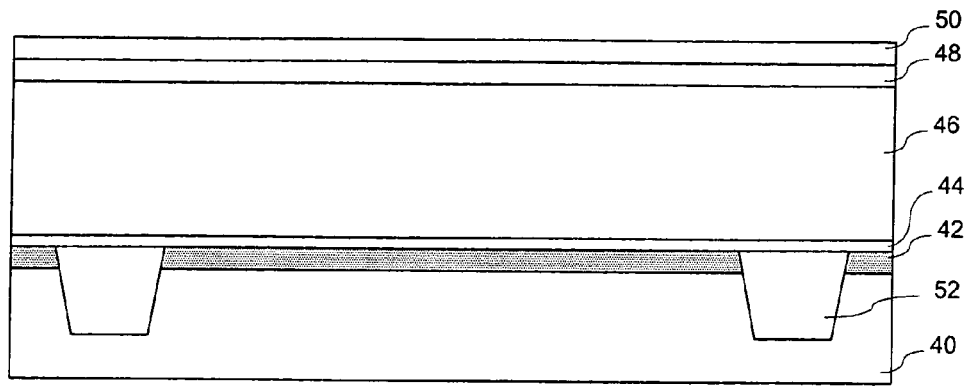
FIGS. 3a, 3b, 3c, 3d, 3e, 3f, 3g, 3h and 3i shows structures formed during production of a PMOS device in accordance with a first preferred embodiment of the invention.

FIGS. 3a–3i show structures formed during fabrication of a strained silicon PMOS in accordance with a preferred embodiment of the invention. FIG. 3a shows a structure comprising a layer of silicon germanium 40 having an epitaxial layer of strained silicon 42 formed on its surface. The silicon germanium layer 40 preferably has a composition $Si_{1-x}Ge_x$, where x is approximately 0.2, and is more generally in the range of 0.1–0.3. The silicon germanium layer 40 typically comprises a silicon germanium layer grown on a silicon wafer. Silicon germanium may be grown, for example, by chemical vapor deposition using $Si_2H_6$ (disilane) and $GeH_4$ (germane) as source gases, with a substrate temperature of 600–900 degrees C., a $Si_2H_6$ partial pressure of 30 mPa, and a $GeH_4$ partial pressure of 60 mPa. Growth of the silicon germanium material may be initiated using these ratios, or alternatively the partial pressure of $GeH_4$ may be gradually increased beginning from a lower pressure or zero pressure to form a gradient composition. The thickness of the silicon germanium layer may be determined in accordance with the particular application. The upper portion of the silicon germanium substrate 40 on which the strained silicon layer 42 is grown should have a uniform composition.

The strained silicon layer 42 is preferably grown by chemical vapor deposition (CVD) using $Si_2H_6$ as a source gas with a partial pressure of 30 mPa and a substrate temperature of approximately 600–900 degrees C. The strained silicon layer is preferably grown to a thickness of 200 Angstroms.

As further shown in FIG. 3a, a gate insulating layer 44 is formed on the strained silicon layer 42. The gate insulating layer 44 is typically silicon oxide but may be another material such as oxide-nitride-oxide (ONO). An oxide may be grown by thermal oxidation of the strained silicon layer, but is preferably deposited by chemical vapor deposition.

Formed over the gate insulating layer 44 is a gate conductive layer 46. The gate conductive layer 46 typically comprises polysilicon but may alternatively comprise another material such as polysilicon implanted with germanium.

Overlying the gate conductive layer 46 is a bi-layer hardmask structure comprising a bottom hardmask layer 48, also referred to as a bottom antireflective coating (BARC), and an upper hardmask layer 50. The bottom hardmask layer 48 is typically silicon oxide (e.g. $SiO_2$) and the upper hardmask layer 50 is typically silicon nitride (e.g. $Si_3N_4$).

The silicon germanium substrate also has formed therein shallow trench isolations 52. The shallow trench isolations may be formed by forming trenches having tapered sidewalls in the silicon germanium 40 and strained silicon 42 layers, performing a brief thermal oxidation, and then depositing a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process, leaving shallow trench isolations 52 that are approximately level with the surface of the strained silicon layer 42.

Figure 3B:
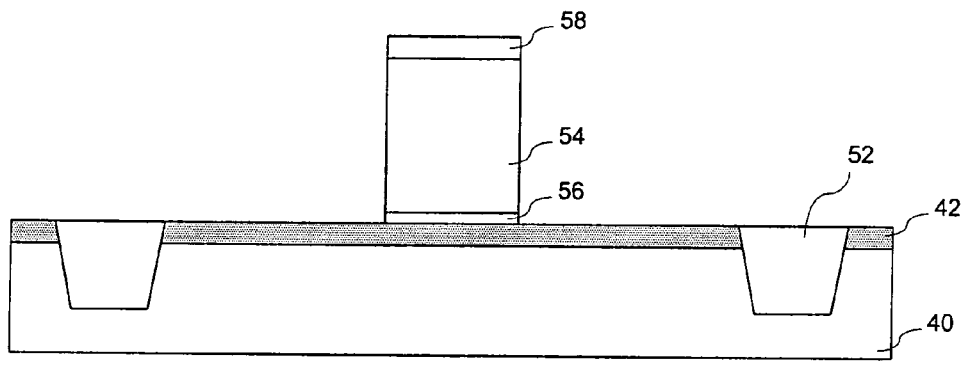

FIG. 3b shows the structure of FIG. 3a after patterning of the polysilicon layer to form a gate 54 and a self-aligned gate insulator 56. Patterning is performed using a series of anisotropic etches that patterns the upper hardmask layer using a photoresist mask as an etch mask, then patterns the lower hardmask layer using the patterned upper hardmask layer as an etch mask, then patterns the polysilicon using the patterned lower hardmask layer as an etch mask, then patterns the gate insulating layer using the gate 54 as a hardmask. As shown in FIG. 3b, the thickness of the lower hardmask layer is chosen such that after patterning of the gate insulating layer, a portion of the lower hardmask layer remains on the gate as a protective cap 58.

Figure 3C:
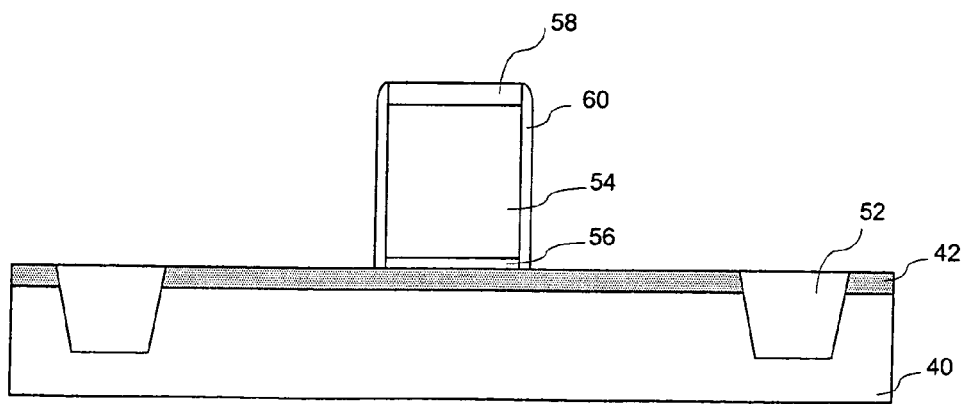

FIG. 3c shows the structure of FIG. 3b after formation of a thin first gate spacer 60 around the gate 54, gate insulator 56, and protective cap 58. The thin first gate spacer 60 is preferably formed by deposition of a conformal layer of a protective material, followed by anisotropic etching to remove the protective material from the non-vertical surfaces to leave the thin first gate spacer 60 formed around the gate 54, gate insulator 56 and protective cap 58. The thin first gate spacer 60 is preferably formed of silicon oxide or silicon nitride.

Figure 3D:
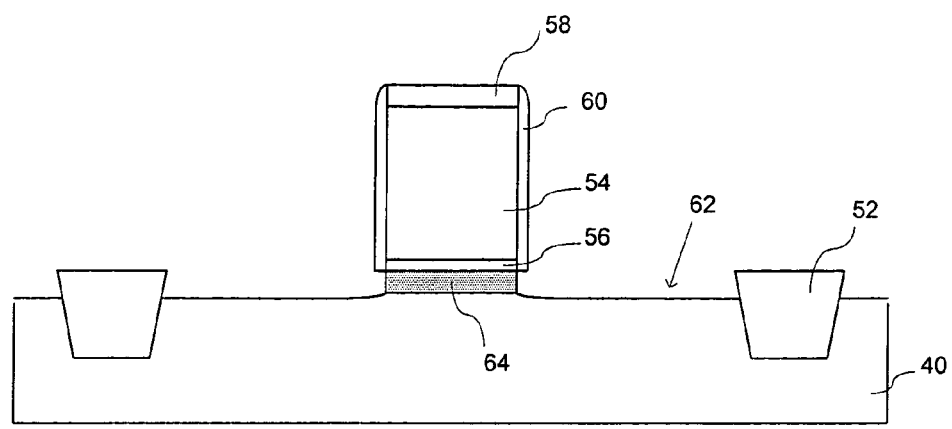

FIG. 3d shows the structure of FIG. 3c after anisotropic etching of the exposed strained silicon and silicon germanium layers to form a strained silicon channel region 64 and trenches 62 at source and drain areas on opposing sides of the strained silicon channel region 64. The etching process is chosen to be selective of silicon with respect to silicon germanium, silicon oxide, and any other exposed protective materials. The etching process is preferably comprised of an anisotropic dry etch, followed by a brief wet etch that produces a small amount of undercutting of the strained silicon beneath the gate insulator 56. As described in more detail below, the thin gate spacers 60 are used in later processing to define the ends of implanted shallow source and drain extensions, and it is an objective of the preferred embodiments that the source and drain extensions not extend into the strained silicon channel region 64. Therefore a small amount of undercutting is desirable so that the ends of the strained silicon channel region 64 are located inward from the outer edges of the first gate spacer 60.

Figure 3E:
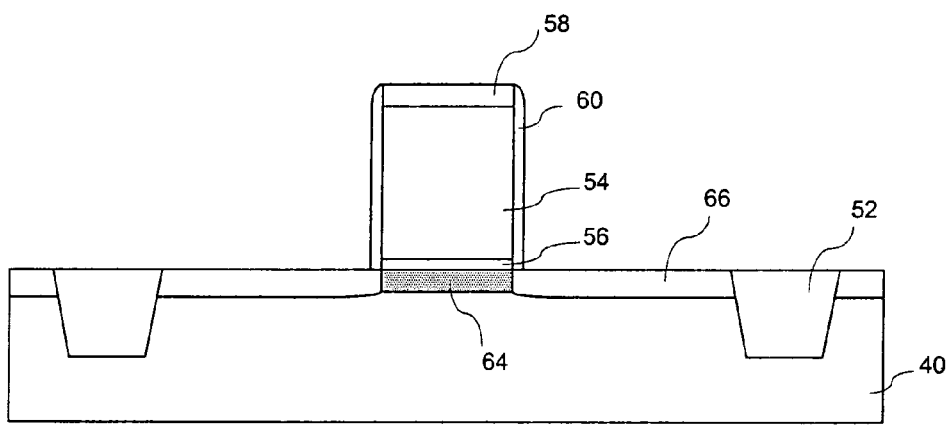

FIG. 3e shows the structure of FIG. 3d after selective growth of silicon germanium in the trenches to form silicon germanium regions 66 on the silicon germanium layer 40 adjacent to ends of the strained silicon channel region 64. The selective growth of silicon germanium is preferably performed in a manner that produces no silicon germanium growth on regions other than the exposed crystalline surfaces of the silicon germanium and strained silicon. Silicon germanium may be grown, for example, by chemical vapor deposition using $Si_2H_6$ (disilane) and $GeH_4$ (germane) as source gases, with a substrate temperature of 600–900 degrees C., a $Si_2H_6$ partial pressure of 30 mPa, and a $GeH_4$ partial pressure of 60 mPa. As a general matter, the selectivity of the deposition process is improved by decreased pressure, increased temperature, and decreased mole fractions of silicon and germanium in the source gas stream. The selective deposition process produces crystalline silicon germanium growth on the exposed crystalline surfaces of the silicon germanium and strained silicon. Silicon germanium material deposited on other surfaces such as the gate spacer 60 and shallow trench isolations 52 will be polycrystalline in form. Where selectivity cannot be precisely controlled, it may be desirable to follow selective growth of silicon germanium with a brief exposure to an etchant that is highly selective to polycrystalline silicon germanium so as to remove any unwanted polycrystalline silicon germanium material from structures such as the gate spacer 60, the shallow trench isolations 52 and the protective cap 58.

Figure 3F:
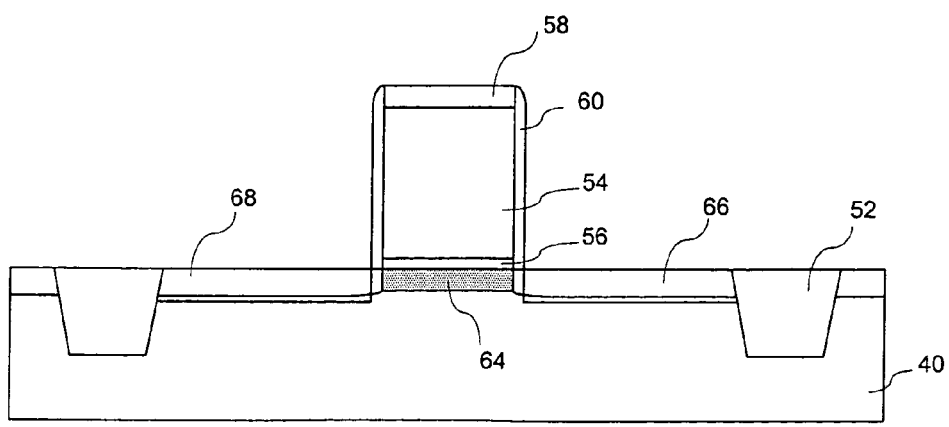

FIG. 3f shows the structure of FIG. 3e after implantation of boron to form shallow p-type source and drain extensions 68 in the silicon germanium regions 66 adjacent to ends of the channel region 64. Halo regions (not shown) may be implanted prior to implantation of the shallow source and drain extensions. Halo regions are regions that are implanted with a dopant that is opposite in conductivity type to the conductivity type of an adjacent region. The dopant of the halo regions retards diffusion of the dopant of the adjacent region. Halo regions are preferably implanted using a low energy at a small angle to the surface of the substrate so that the halo regions extend beneath the gate 54 to beyond the anticipated locations of the ends of the source and drain extensions 68 after annealing. Like the source and drain extensions 68, the halo regions are formed at opposing sides of the channel region, and extend toward the channel region beyond the ends of the source and drain extensions to be formed.

Figure 3G:
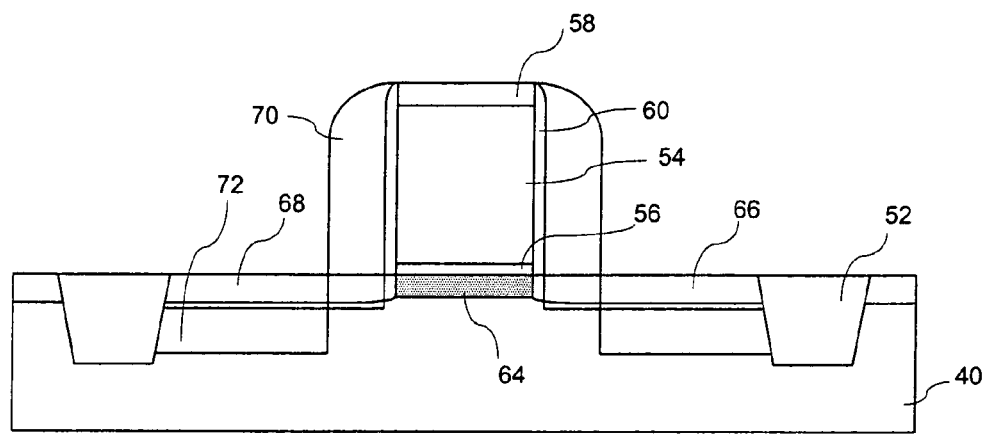

FIG. 3g shows the structure of FIG. 3f after formation of a second spacer 70 around the gate 54 and the thin first spacer 60, followed by implantation of boron to form deep p-type source and drain regions 72 in the silicon germanium regions 66 and silicon germanium layer 40. The second spacer 70 serves as an implant mask during implantation of the deep source and drain regions 72 to define the position of the source and drain regions 72 relative to the channel region 64.

Figure 3H:
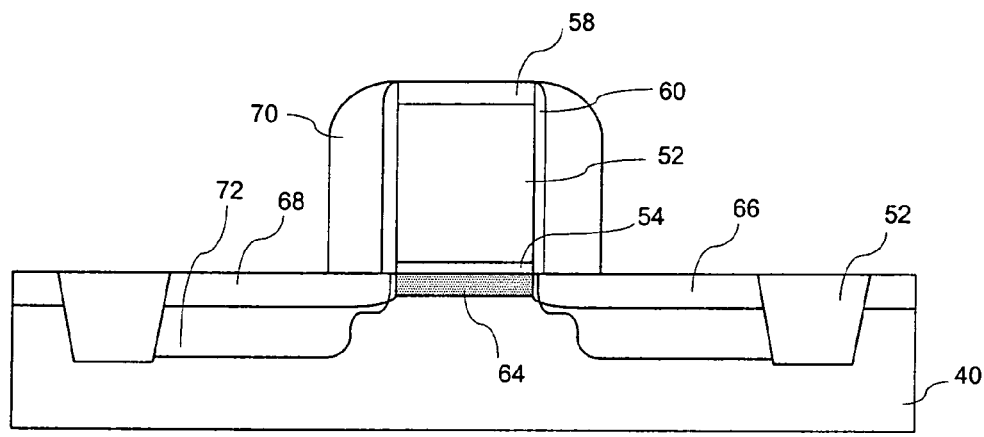

FIG. 3h shows the structure of FIG. 3g after performing rapid thermal annealing (RTA) to anneal the silicon germanium regions 66 and silicon germanium layer 40 and to activate the dopants implanted in the shallow source and drain extensions 68 and the deep source and drain regions 72. During annealing the implanted boron dopant diffuses through the silicon germanium regions 66 and the silicon germanium layer 40. Since the rate of diffusion of boron in silicon germanium is less than in silicon, the shallow source and drain extensions 68 encroach less upon the channel region than if formed in silicon, and therefore the resistance to punchthrough is improved.

Figure 3I:
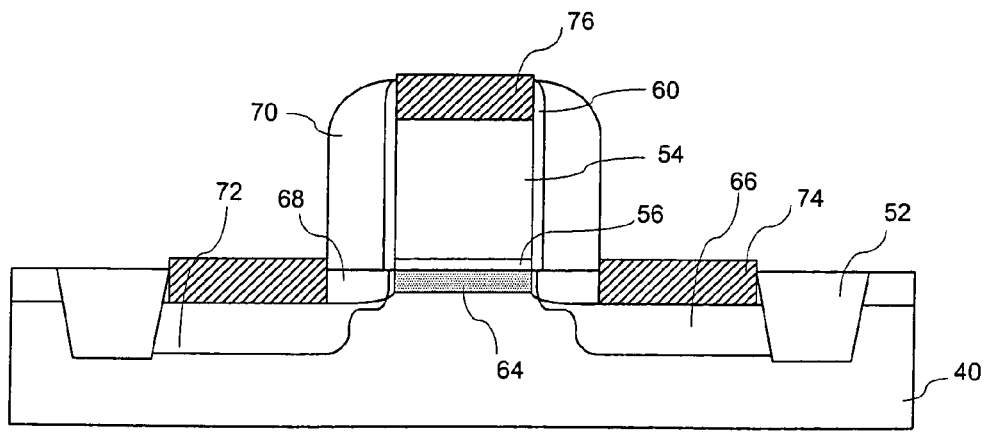

FIG. 3i shows the structure of FIG. 3h after removal of the protective gate cap 58 to expose the upper surface of the gate 54, followed by formation of silicide contacts 74 on the source and drain regions 72 and formation of a silicide contact 76 on the gate 54. The silicide contacts are formed of a compound comprising a semiconductor material and a metal. Typically a metal such as cobalt (Co) is used, however other metals such as nickel (Ni) may also be employed. The silicide contacts are formed by depositing a thin conformal layer of the metal over the substrate, and then annealing to promote silicide formation at the points of contact between the metal and underlying semiconductor materials, followed by stripping of residual metal.

While the processing shown in FIGS. 3a–3i represents a presently preferred embodiment, a variety of alternatives may be implemented. For example, in one alternative embodiment, the strained silicon layer may be etched using an anisotropic etch process that forms a strained silicon channel that is self aligned with the first thin gate spacer. A second gate spacer may then be formed after growth of the silicon germanium regions and prior to implanting the source and drain extensions, and a third gate spacer may be formed prior to implanting the deep source and drain regions. This achieves separation between the strained silicon channel region and the ends of the source and drain extensions without the need for undercutting of the strained silicon by wet etching as in the preferred embodiment.

Accordingly, a variety of embodiments in accordance with the invention may be implemented. In general terms, such embodiments encompass a p-type MOSFET that includes a strained silicon channel region, and source and drain extensions and source and drain regions that are contained within silicon germanium portions of the MOSFET. By containing the source and drain extensions and regions within silicon germanium, the enhanced diffusion rate of boron in silicon is avoided, and the boron dopant of the source and drain regions and source and drain extensions undergo relatively little diffusion.

Figure 4:
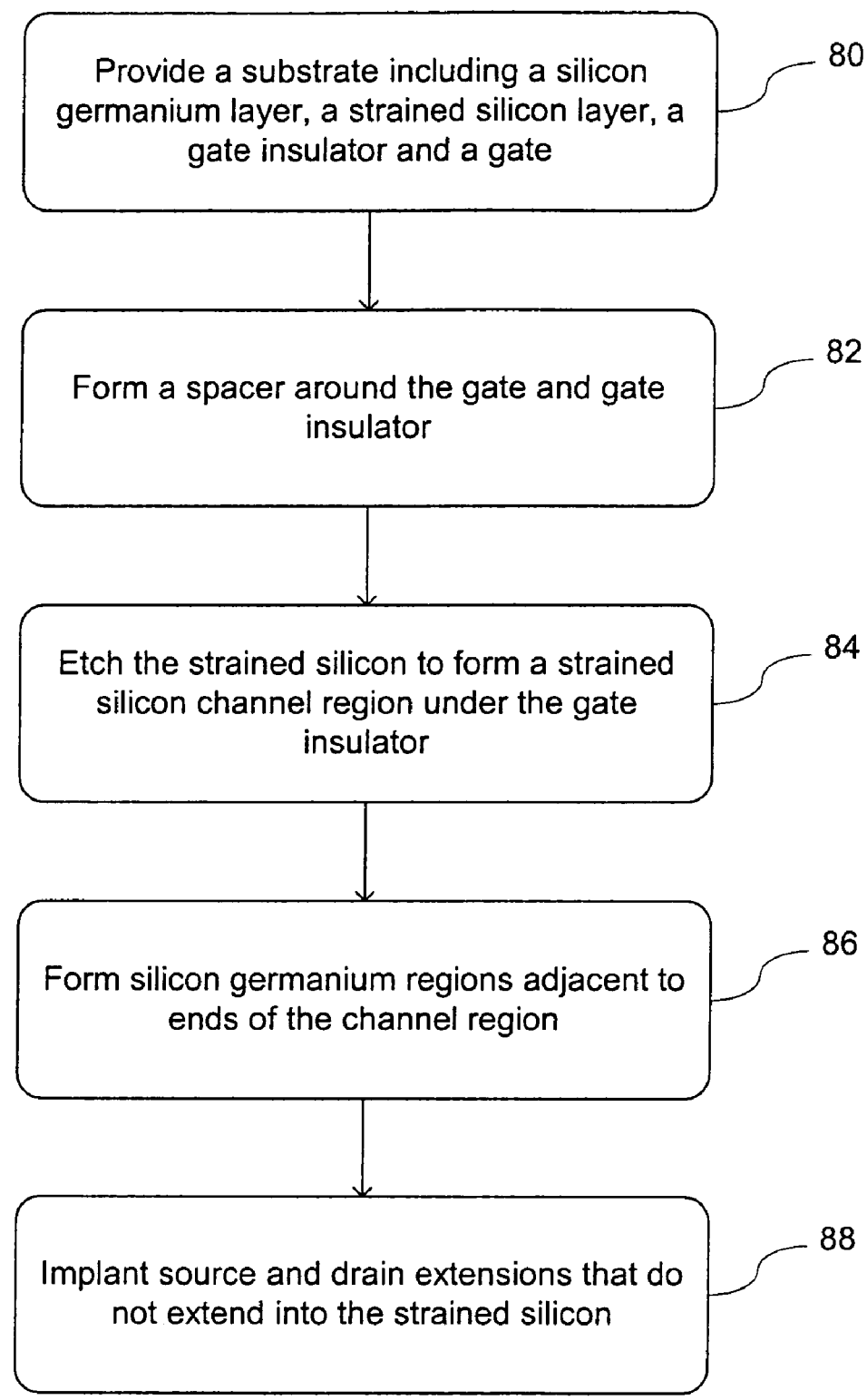
FIG. 4 shows a process flow encompassing the first preferred embodiment and alternative embodiments.

FIG. 4 shows a process flow encompassing the preferred embodiment of FIGS. 3a–3i, the aforementioned alternatives and other alternatives. Initially a substrate is provided (80). The substrate includes a layer of silicon germanium having a layer of strained silicon formed thereon. The substrate further includes a gate insulator formed on the strained silicon layer and a gate formed on the gate insulator. A first spacer is then formed around the gate and gate insulator (82). The strained silicon layer is then etched to form a strained silicon channel region beneath the gate insulator (84). Silicon germanium regions are then formed adjacent to the ends of the channel region (86), and shallow source and drain extensions are implanted in silicon germanium material adjacent to the ends of the channel region (88). The implanted shallow source and drain extensions do not extend into the strained silicon channel region.

In further embodiments it may be desirable to impart compressive strain to the silicon germanium material that underlies the strained silicon channel region in order to improve hole mobility. This may be achieved by implanting germanium into the silicon germanium material. The germanium may be implanted prior to formation of gate material layers or after gate patterning. This may be performed on PMOS devices or both PMOS and NMOS devices.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for forming a p-type metal oxide semiconductor field effect transistor (MOSFET), comprising:
    providing a substrate comprising a layer of silicon germanium having a layer of strained silicon formed thereon, and having a gate insulator formed on the strained silicon layer and a gate formed on the gate insulator;
    forming a first spacer around the gate and gate insulator;
    removing the strained silicon layer from source and drain regions to form trenches that expose the silicon germanium layer in the source and drain regions and to form a strained silicon channel region beneath the gate insulator;
    growing silicon germanium regions on the silicon germanium layer to fill the trenches; and
    implanting shallow source and drain extensions in silicon germanium material adjacent to ends of the channel region, wherein the shallow source and drain extensions do not extend into to the strained silicon channel region after being implanted.

2. The method claimed in claim 1, wherein, after removing the strained silicon from the source and drain regions, the strained silicon channel region is undercut with respect to the first spacer.

3. The method claimed in claim 2, wherein said removing comprises a dry anisotropic etch process followed by a wet isotropic etch process.

4. The method claimed in claim 1, further comprising implanting deep source and drain regions in the silicon germanium regions and silicon germanium layer.

5. The method claimed in claim 4, wherein implanting the deep source and drain regions is preceded by forming a second spacer around the first spacer, and
    wherein the second spacer serves as an implantation mask during implanting of the deep source and drain regions.

6. The method claimed in claim 4, further comprising annealing to activate implanted dopants.

7. The method claimed in claim 6, wherein the source and drain extensions do not extend into the strained silicon channel region after being annealed.

8. The method claimed in claim 6, further comprising forming suicide source and drain contacts and a silicide gate contact.

9. The method claimed in claim 8, wherein the silicide source and drain contacts and silicide gate contact comprise nickel.

10. The method claimed in claim 1, wherein the dopant of the source and drain extensions is boron.

11. The method claimed in claim 1, wherein the silicon germanium layer has a composition $Si_{1-x}Ge_x$, where x is in the range of 0.1 to 0.3.

12. The method claimed in claim 1, wherein the gate comprises polysilicon.

13. The method claimed in claim 1, wherein the gate insulator comprises silicon oxide.

14. The method claimed in claim 1, wherein implanting source and drain extensions is preceded by implanting halo regions in the silicon regions at opposing sides of the channel region, the halo regions extending toward the channel region beyond ends of the source and drain extensions to be formed, the halo regions comprising a dopant having a conductivity type opposite to the conductivity type of a dopant of the source and drain extensions.

15. The method claimed in claim 1, wherein the silicon germanium regions are formed in the trenches by selective epitaxial growth.

16. The method claimed in claim 1, wherein a second spacer is formed around the first spacer prior to implanting the shallow source and drain extensions.

17. The method claimed in claim 16, wherein implanting the deep source and drain regions is preceded by forming a third spacer around the gate and gate insulator, and
    wherein the third spacer serves as an implantation mask during implanting of the deep source and drain regions.

18. The method claimed in claim 1, wherein the strained silicon layer is removed from the source and drain regions adjacent to ends of said channel region.

19. The method claimed in claim 18, wherein said silicon germanium regions replace said removed strained silicon layer so that there is no strained silicon in source and drain regions of the MOSFET.

* * * * *